US010047457B2

(12) United States Patent
Shah et al.

(10) Patent No.: US 10,047,457 B2
(45) Date of Patent: Aug. 14, 2018

(54) EPI PRE-HEAT RING

(71) Applicant: Applied Materials, Inc., Santa Clara, CA (US)

(72) Inventors: Kartik Shah, Sunnyvale, CA (US); Shu-Kwan Lau, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 918 days.

(21) Appl. No.: 14/461,137

(22) Filed: Aug. 15, 2014

(65) Prior Publication Data

US 2015/0075430 A1 Mar. 19, 2015

Related U.S. Application Data

(60) Provisional application No. 61/878,420, filed on Sep. 16, 2013.

(51) Int. Cl.
*C23C 16/458* (2006.01)
*C30B 25/08* (2006.01)
(Continued)

(52) U.S. Cl.
CPC .......... *C30B 25/14* (2013.01); *C23C 16/4585* (2013.01); *C30B 25/08* (2013.01);
(Continued)

(58) Field of Classification Search
None
See application file for complete search history.

(56) References Cited

U.S. PATENT DOCUMENTS 1,784,142 A * 12/1930 Hosking ................. B21D 51/20
29/DIG. 40
4,163,573 A * 8/1979 Yano ..................... F16L 37/088
285/148.13
(Continued)

FOREIGN PATENT DOCUMENTS

CN 101038849 A 9/2007
CN 102751181 A 10/2012
(Continued)

OTHER PUBLICATIONS

International Search Report and Written Opinion for International Application No. PCT/US2014/051603 dated Dec. 2, 2014.
(Continued)

*Primary Examiner* — Jeffrie R Lund
*Assistant Examiner* — Stanislav Antolin
(74) *Attorney, Agent, or Firm* — Patterson + Sheridan LLP

(57) ABSTRACT

Embodiments of the present disclosure generally relate to a process chamber having a pre-heat ring for heating the process gas. In one embodiment, the process chamber includes a chamber body defining an interior processing region, a substrate support disposed within the chamber body, the substrate support having a substrate support surface for supporting a substrate, and a pre-heat ring positioned on a ring support disposed within the chamber body, wherein a portion of the pre-heat ring is tilted downwardly by a predetermined angle towards the gas exhaust side with respect to the substrate support surface to promote the purge gas flowing more through the gas exhaust side than the gas injection side.

15 Claims, 5 Drawing Sheets

(51) Int. Cl.
  *C30B 25/14* (2006.01)
  *C30B 25/12* (2006.01)
  *C30B 25/10* (2006.01)
(52) U.S. Cl.
  CPC .............. *C30B 25/10* (2013.01); *C30B 25/12* (2013.01); *Y10T 428/218* (2015.01)

(56) References Cited

U.S. PATENT DOCUMENTS

| | | | | |
|---|---|---|---|---|
| 4,322,878 | A * | 4/1982 | Warchol | B21D 53/12 29/898.067 |
| 5,221,556 | A * | 6/1993 | Hawkins | C23C 16/455 118/715 |
| 5,261,960 | A * | 11/1993 | Ozias | C30B 25/10 118/715 |
| 5,916,370 | A * | 6/1999 | Chang | H01L 21/68757 118/500 |
| 6,013,319 | A * | 1/2000 | Dietze | C23C 16/4401 117/102 |
| 6,153,260 | A * | 11/2000 | Comita | C23C 16/4408 118/719 |
| 6,315,833 | B1 * | 11/2001 | Callaghan | H01L 21/67748 118/500 |
| 6,395,363 | B1 | 5/2002 | Ballance et al. | |
| 6,399,510 | B1 * | 6/2002 | Riley | C23C 16/455 156/345.1 |
| 6,635,080 | B1 * | 10/2003 | Lauterjung | A61F 2/07 623/1.13 |
| 7,648,578 | B1 * | 1/2010 | Itatani | C23C 16/4412 118/715 |
| 8,512,472 | B2 | 8/2013 | Vatus et al. | |
| 2002/0020358 | A1 * | 2/2002 | Hey | C23C 16/44 118/725 |
| 2002/0160112 | A1 * | 10/2002 | Sakai | C23C 16/455 427/255.28 |
| 2002/0179586 | A1 * | 12/2002 | Wengert | B01J 3/006 219/390 |
| 2003/0079689 | A1 * | 5/2003 | Sumakeris | C23C 16/4581 118/725 |
| 2003/0119283 | A1 * | 6/2003 | Ishibashi | C23C 16/4412 438/478 |
| 2003/0227258 | A1 * | 12/2003 | Strang | H01J 37/32449 315/111.21 |
| 2004/0040632 | A1 * | 3/2004 | Oosterlaken | H01L 21/67309 148/527 |
| 2004/0144323 | A1 * | 7/2004 | Kai | C23C 16/45521 118/728 |
| 2004/0149389 | A1 * | 8/2004 | Fink | H01J 37/32642 156/345.51 |
| 2005/0005859 | A1 * | 1/2005 | Koshiishi | H01J 37/32642 118/728 |
| 2005/0106524 | A1 | 5/2005 | Ose | |
| 2006/0096622 | A1 * | 5/2006 | Lee | B08B 5/02 134/94.1 |
| 2006/0249695 | A1 * | 11/2006 | Choi | F27B 5/04 250/492.2 |
| 2006/0254717 | A1 * | 11/2006 | Kobayashi | C23F 4/00 156/345.44 |
| 2006/0266279 | A1 * | 11/2006 | Mokuno | C30B 25/20 117/68 |
| 2007/0039811 | A1 * | 2/2007 | Yanai | H01H 13/48 200/406 |
| 2007/0107653 | A1 * | 5/2007 | Yamada | C23C 16/455 117/84 |
| 2007/0111339 | A1 * | 5/2007 | Wege | H01J 37/32623 438/10 |
| 2007/0122323 | A1 * | 5/2007 | Yamada | C23C 16/45587 422/243 |
| 2007/0187037 | A1 * | 8/2007 | Choi | G03F 7/3021 156/345.11 |
| 2007/0215279 | A1 * | 9/2007 | Koshiishi | H01J 37/32623 156/345.3 |
| 2008/0006208 | A1 * | 1/2008 | Ueno | C23C 16/303 118/730 |
| 2008/0066684 | A1 * | 3/2008 | Patalay | C23C 16/45521 118/728 |
| 2008/0069951 | A1 * | 3/2008 | Chacin | C23C 16/45521 427/248.1 |
| 2008/0099439 | A1 * | 5/2008 | Chang | H01J 37/32623 216/67 |
| 2008/0216742 | A1 * | 9/2008 | Takebayashi | C23C 16/45546 118/715 |
| 2008/0220150 | A1 | 9/2008 | Merry et al. | |
| 2009/0031954 | A1 * | 2/2009 | Nishikido | C23C 16/4581 118/725 |
| 2009/0110826 | A1 * | 4/2009 | Aggarwal | C23C 16/4412 427/255.28 |
| 2009/0194024 | A1 * | 8/2009 | Burrows | C23C 16/452 118/712 |
| 2009/0217877 | A1 * | 9/2009 | Lopez | C23C 16/45504 118/728 |
| 2009/0314205 | A1 | 12/2009 | Patalay et al. | |
| 2010/0029066 | A1 * | 2/2010 | Miyashita | C23C 16/4584 438/478 |
| 2010/0032139 | A1 * | 2/2010 | Tian | H01L 23/467 165/104.31 |
| 2010/0101618 | A1 * | 4/2010 | van Aalst | E04H 15/40 135/126 |
| 2010/0116436 | A1 * | 5/2010 | Kitajima | B23P 15/00 156/345.1 |
| 2010/0215872 | A1 * | 8/2010 | Sivaramakrishnan | C23C 16/4582 427/585 |
| 2010/0300622 | A1 * | 12/2010 | Yatsuda | H01J 37/32091 156/345.44 |
| 2010/0300623 | A1 * | 12/2010 | Motokawa | G03F 1/46 156/345.51 |
| 2011/0042009 | A1 * | 2/2011 | Lee | H01J 37/3244 156/345.43 |
| 2012/0000886 | A1 * | 1/2012 | Honda | H01J 37/18 216/24 |
| 2012/0073503 | A1 * | 3/2012 | Huang | C30B 25/08 118/725 |
| 2012/0103263 | A1 * | 5/2012 | Myo | C23C 16/45591 118/728 |
| 2012/0171870 | A1 * | 7/2012 | Mitrovic | C23C 16/45504 438/706 |
| 2012/0234243 | A1 * | 9/2012 | Olgado | C23C 16/4584 118/730 |
| 2012/0263875 | A1 | 10/2012 | Brenninger et al. | |
| 2012/0266819 | A1 | 10/2012 | Sanchez et al. | |
| 2012/0273005 | A1 | 11/2012 | Ramachandran et al. | |
| 2012/0309175 | A1 * | 12/2012 | Masumura | C23C 16/4585 438/478 |
| 2013/0008607 | A1 | 1/2013 | Matsumoto et al. | |
| 2013/0008610 | A1 * | 1/2013 | Jiang | C23C 16/45504 156/345.55 |
| 2013/0102155 | A1 * | 4/2013 | Gang | H05H 1/30 438/710 |
| 2013/0152859 | A1 | 6/2013 | Collins et al. | |
| 2013/0220550 | A1 * | 8/2013 | Koo | B05C 11/00 156/345.51 |
| 2014/0116340 | A1 * | 5/2014 | Mori | C23C 16/45502 118/725 |
| 2014/0184072 | A1 * | 7/2014 | Jacofsky | H01J 37/32899 315/111.21 |
| 2014/0261159 | A1 * | 9/2014 | Okabe | C30B 25/12 117/98 |
| 2014/0261178 | A1 * | 9/2014 | Du Bois | C23C 16/509 118/723 E |

FOREIGN PATENT DOCUMENTS

| | | |
|---|---|---|
| JP | 2006049462 A | 2/2006 |
| JP | 2007250967 A | 9/2007 |

(56) References Cited

FOREIGN PATENT DOCUMENTS

JP      WO2005124845 A1    4/2008
JP      WO 2011118742 A1 *  9/2011  ....... C23C 16/45504

OTHER PUBLICATIONS

Search Report for Chinese Application No. 2014800484101 and Office Action for Chinese Application No. 2014800484101 both dated Feb. 2, 2018.
Japanese Office Action dated May 8, 2018 for Application No. 2016-541986.
Taiwan Search Report dated Apr. 2, 2018 for Application No. 103129206.

* cited by examiner

EPI PRE-HEAT RING

CROSS-REFERENCE TO RELATED APPLICATIONS

This application claims benefit of U.S. provisional patent application Ser. No. 61/878,420 filed Sep. 16, 2013, which is herein incorporated by reference.

BACKGROUND

Field

Embodiments of the disclosure generally relate to a pre-heat ring for use in a substrate processing chamber.

Description of the Related Art

Continuous reduction in size of semiconductor devices is dependent upon more precise control of, for instance, the flow and temperature of process gases delivered to a semiconductor process chamber. Typically, in a cross-flow process chamber, a process gas may be delivered to the chamber and directed across the surface of a substrate to be processed. The temperature of the process gas may be controlled by, for example, a pre-heat ring, which surrounds the substrate support.

FIG. 1 illustrates a schematic sectional view of a cross-flow process chamber 100. The process chamber 100 has a rotational substrate support 102 disposed within a processing region defined by an upper dome 104, a lower dome 106, and a chamber side wall 108. The process gas(es) supplied from a process gas source 110 is introduced to the upper processing region 112 through a process gas inlet 114. The process gas inlet 114 is configured to direct the process gas in a laminar flow fashion (e.g., a generally radially inward direction as indicated by flow path 116). During processing, a purge gas is also introduced from a purge gas source 122 into the lower processing chamber 126 through a purge gas inlet 124 at a pressure relatively greater than the pressure of the process gases in the upper processing region 112. A portion of the purge gas will flow upwardly to seep between the substrate support 102 and a pre-heat ring 103 and flow into the upper processing region 112. The upward flow of the purge prevents the process gas from flowing into the lower processing chamber 126, thereby minimizing deposition of undesirable reactant products on the lower dome 106 which would negatively diminish the thermal radiation from the lamps positioned below the lower dome 106. The process gas and the purge gas exit the upper processing region 112 through a gas outlet 118 (opposite the process gas inlet 114) coupled to an exhaust 120.

However, it has been observed that the purge gas flowing upwardly into the upper processing region 112 may cause dilution of the concentration of the process gas near the edge of the substrate 128. The dilution is mainly created near the edge of the substrate 128 which forms turbulence and additional resistance of flow (indicated as region "A") through which the process gas has to diffuse to travel to the surface of the substrate 128. Therefore, the deposition efficiency at the edge of the substrate is suffered. While rotating the substrate during deposition can create a rotationally symmetric deposition, the uniformity of the film, especially near the edge of the substrate 128, is reduced due to the poor deposition efficiency caused by the dilution. As a result, the film thickness near the edge of the substrate is decreased (edge roll-off effect).

Since flow characteristics directly impact the film uniformity on the substrate, there is a need for an improved deposition apparatus which reduces or eliminates dilution of process gas near the edge of the substrate and prevents the process gas from entering into the lower processing region of the process chamber during processing.

SUMMARY

Embodiments of the present disclosure generally relate to a process chamber having an improved pre-heat ring for heating the process gas. In one embodiment, the process chamber includes a chamber body defining an interior processing region, a substrate support disposed within the chamber body, the substrate support having a substrate support surface for supporting a substrate, and a pre-heat ring positioned on a ring support disposed within the chamber body, wherein a portion of the pre-heat ring is inclined towards the gas exhaust side by an angle with respect to the substrate support surface to promote the purge gas flowing more through the gas exhaust side than the gas injection side.

In another embodiment, a ring assembly for used in a semiconductor processing chamber is provided. The ring assembly has an annular body having a central opening, an inner peripheral edge and an outer peripheral edge, the annular body comprising a first half circular portion, and a second half circular portion, wherein the second half circular portion is inclined towards a gas exhaust side by an angle with respect to an upper surface of the first half circular portion to promote the purge gas flowing more through the gas exhaust side than the gas injection side.

In yet another embodiment, a process chamber for processing a substrate is provided. The process chamber includes a rotatable substrate support disposed within the process chamber, the substrate support having a substrate support surface for supporting a substrate, a lower dome disposed relatively below the substrate support, an upper dome disposed relatively above the substrate support, the upper dome being opposed to the lower dome, a ring body disposed between the upper dome and the lower dome, wherein the upper dome, the ring body, and the lower dome generally defining an internal volume of the process chamber, the ring body having one or more gas injects arranged in at least one linear group to provide a gas flow that is wide enough to substantially cover a diameter of the substrate, a pre-heat ring disposed on a ring support coupling to the ring body, wherein a portion of the pre-heat ring is inclined towards the gas exhaust side by a predetermined angle with respect to the substrate support surface to promote the purge gas flowing more through the gas exhaust side than the gas injection side.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, for purposes of explanation, numerous specific details are set forth in order to provide a thorough understanding of the present disclosure. In some instances, well-known structures and devices are shown in block diagram form, rather than in detail, in order to avoid obscuring the present disclosure. These embodiments are described in sufficient detail to enable those skilled in the art to practice the disclosure, and it is to be understood that other embodiments may be utilized and that logical, mechanical, electrical, and other changes may be made without departing from the scope of the present disclosure.

Exemplary Process Chamber

Figure 1:
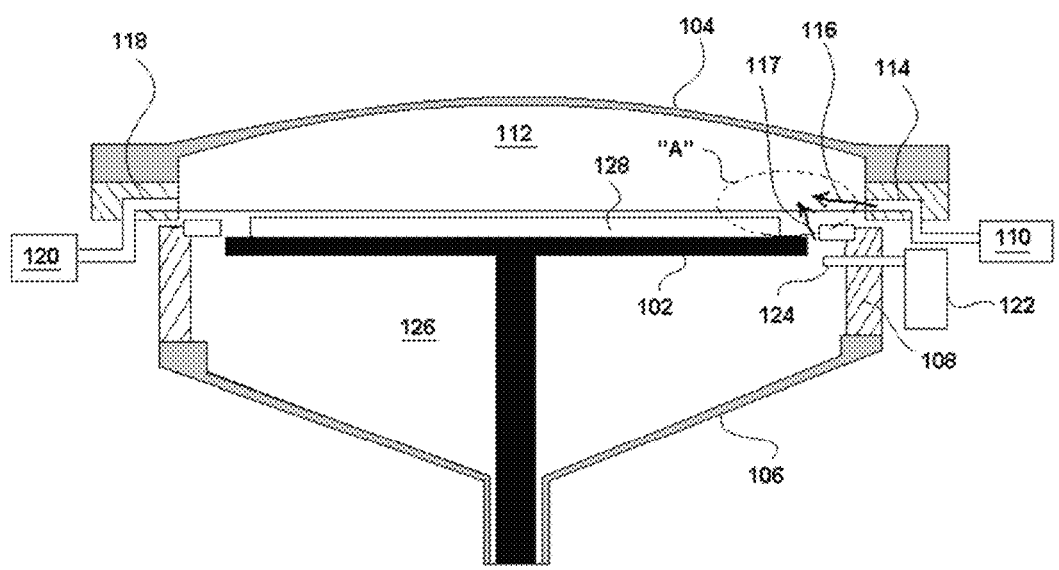
FIG. 1 depicts a schematic sectional view of a cross-flow process chamber.
Figure 2:
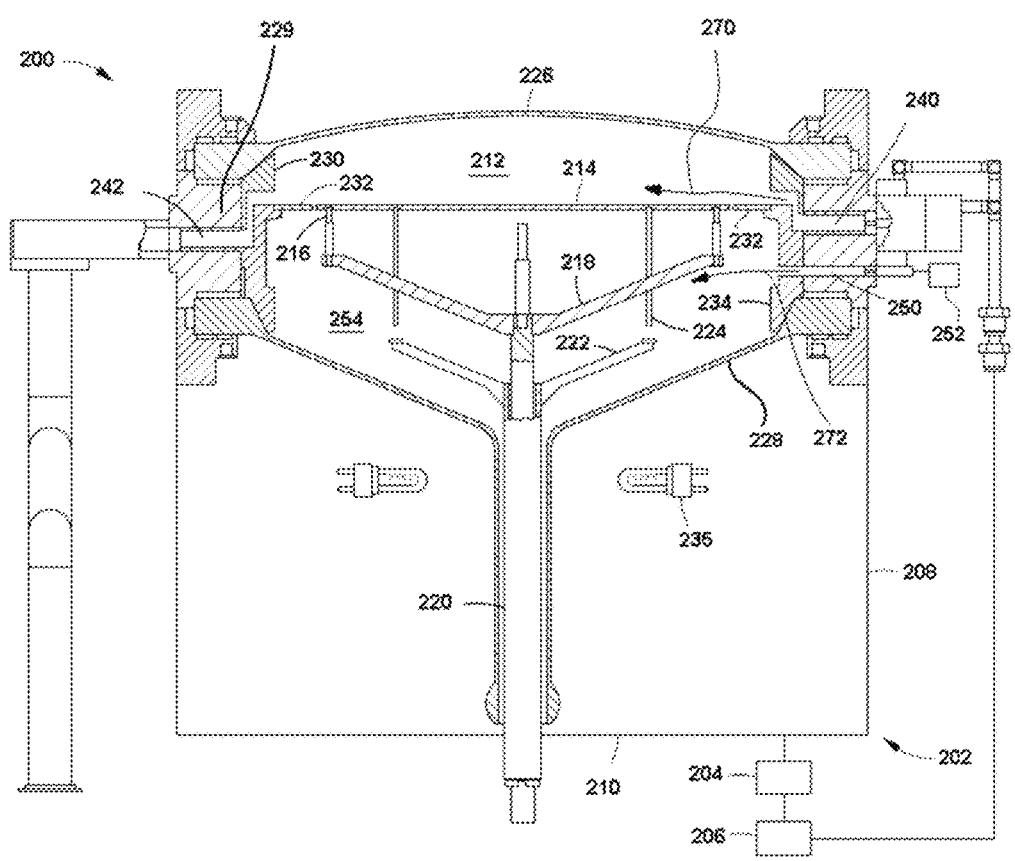
FIG. 2 depicts a schematic sectional view of an exemplary process chamber according to one embodiment.

FIG. 2 illustrates a schematic sectional view of an exemplary process chamber 200 according to one embodiment. A non-limiting example of one suitable process chamber is the RP EPI reactor, which is commercially available from Applied Materials, Inc. of Santa Clara, Calif. While the process chamber 200 is described below to be utilized to practice various embodiments described herein, other semiconductor process chamber from a different manufacturer may also be used to practice the embodiment described in this disclosure. The process chamber 200 may be adapted for performing chemical vapor deposition, such as epitaxial deposition processes. The process chamber 200 illustratively includes a chamber body 202, support systems 204, and a controller 206. The chamber body 202 has an upper dome 226, a side wall 208 and a bottom wall 210 defining an interior processing region 212. A substrate support 214 used for supporting a substrate is disposed in the interior processing region 212. The substrate support 214 is rotated and supported by support posts 216, which are connected with supporting arms 218 that extend from a shaft 220. During operation, the substrate disposed on the substrate support 214 may be raised by substrate lift arms 222 through lift pins 224. The substrate support 214 may be a disk-like substrate support as shown, or may be a ring-like substrate support with no central opening, which supports the substrate from the edge of the substrate to facilitate exposure of the substrate to the thermal radiation of the lamps 235.

An upper dome 226 is disposed over the substrate support 214 and a lower dome 228 is disposed below the substrate support 214. Deposition processes generally occur on the upper surface of the substrate disposed on the substrate support 214 within the interior processing region 212.

An upper liner 230 is disposed below the upper dome 226 and is adapted to prevent unwanted deposition onto chamber components, such as a base ring 229 or a peripheral flange 231 which engages the central window portion 233 of the upper dome 226 around a circumference of the central window portion 233. The upper liner 230 is positioned adjacent to a pre-heat ring 232. The pre-heat ring 232 is configured to be disposed around the periphery of the substrate support 214 while the substrate support 214 is in a processing position. The radial width of the pre-heat ring 232 extends to a degree between the substrate support 214 and a ring support 234 to prevent or minimize leakage of heat/light noise from the lamps 235 to the device side of the substrate while providing a pre-heat zone for the process gases flowing thereabove. The pre-heat ring 232 is removably disposed on the ring support 234 that supports and positions the pre-heat ring 232 such that the process gas flows into the interior processing region 212 in a laminar flow fashion (e.g., a generally radially inward direction as indicated by flow path 270) across an upper surface of the substrate support 214. The ring support 234 may be a liner disposed within the process chamber.

The pre-heat ring 232 may be fabricated from any suitable material for absorbing energy from a lamp (such as lamps 235). In some embodiments, the pre-heat ring 232 may be made from quartz, silicon carbide ($SiC_y$), graphite coated with silicon carbide ($SiC_y$), opaque quartz, coated quartz, or any similar, suitable material that is resistant to chemical breakdown by process gases, wherein y represents known silicon carbide components. In one embodiment, the pre-heat ring 232 comprises graphite coated with silicon carbide.

The base ring 229 may have a ring body sized to fit within an inner circumference of the processing chamber 200. The ring body may have a generally circular shape. The inner circumference of the base ring 229 is configured to receive the ring support 234. In one example, the ring support 234 is sized to be nested within or surrounded by an inner circumference of the base ring 229. Although the term "ring" is used to describe certain components of the process chamber, such as the pre-heat ring 232 or the base ring 229, it is contemplated that the shape of these components need not be circular and may include any shape, including but not limited to, rectangles, polygons, ovals, and the like.

The processing chamber 200 includes a plurality of heat sources, such as lamps 235, which are adapted to provide thermal energy to components positioned within the process chamber 200. For example, the lamps 235 may be adapted to provide thermal energy to the substrate and the preheat ring 232, resulting in thermal decomposition of the process gases onto the substrate to form one or more layers on the substrate. In some embodiments, the array of radiant heating lamps 235 may be alternatively or additionally disposed over the upper dome 226. The lower dome 228 may be formed from an optically transparent material, such as quartz, to facilitate the passage of thermal radiation therethrough. The temperature of the preheat ring 232 during operation may be about 100 degrees Celsius to about 800 degrees Celsius. During processing, the substrate support 214 may be heated to 1000 degrees Celsius and the preheat ring 232 may be heated to about 650-750 degrees Celsius. The heated preheat ring 232 activates the process gases as the process gases flow into the process chamber 200 through the process gas inlet 240 that is formed through the base ring 229. The process gases exit the process chamber 200 through the process gas outlet 242 disposed opposite the process gas inlet 240. As the process gas inlet 240, the substrate support 214 and the process gas outlet 242 are at about the same elevation during processing, the process gases are flowed along flow path 270 across the upper surface of the substrate (not shown) in a generally planar, laminar flow fashion to the process gas outlet 242. Further radial uniformity may be provided by the rotation of the substrate through the substrate support 214.

While one process gas inlet 240 is shown, the process gas inlet 240 may include two or more gas inlets for delivering two or more individual gas flows. The process gas inlet 240 may be configured to provide individual gas flows with varied parameters, such as velocity, density, or composition. In one embodiment where multiple process gas inlets are adapted, the process gas inlet 240 may be distributed along a portion of the base ring 229 in a substantial linear arrangement to provide a gas flow that is wide enough to substantially cover the diameter of the substrate. For example, the process gas inlets 240 may be arranged to the extent possible in at least one linear group to provide a gas flow generally corresponding to the diameter of the substrate.

The processing chamber 200 may include a purge gas inlet 250 formed through the base ring 229. The purge gas inlet 250 may be disposed at an elevation below the process gas inlet 240. In one example, the pre-heat ring 232 is disposed between the process gas inlet 240 and the purge gas inlet 250. The purge gas inlet 250 may provide a flow of an inert purge gas, such as hydrogen, from a purge gas source 252 into the lower portion 254 (i.e., a processing region below the substrate support 214) of the processing chamber 200 at a pressure greater than the pressure of the process gases in the upper portion (i.e., a processing region above the substrate support 214) of the processing chamber 200. In one embodiment, the purge gas inlet 250 is configured to direct the purge gas in a generally radially inward direction. During the film deposition process, the substrate support 214 may be located at a position such that the purge gas flows down and round along flow path 272 across back side of the substrate support 214 in a laminar flow fashion. The flowing of the purge gas is believed to prevent or substantially avoid the flow of the process gas from entering into the lower portion 254, or to reduce diffusion of the process gas entering the lower portion 254. The purge gas exits the lower portion 254 and is exhausted out of the processing chamber 200 through the process gas outlet 242, which is located at the side opposite the purge gas inlet 250.

The support system 204 may include components used to execute and monitor pre-determined processes, such as the growth of films in the processing chamber 200. The support system 204 includes one or more of gas panels, gas distribution conduits, vacuum and exhaust sub-systems, power supplies, and process control instruments. A controller 206 is coupled to the support system 204 and is adapted to control the processing chamber 200 and support system 204. The controller 206 includes a central processing unit (CPU), a memory, and support circuits. Instructions resident in controller 206 may be executed to control the operation of the processing chamber 200 or one or more film deposition processes therein.

Exemplary Pre-Heat Ring

Figure 3:
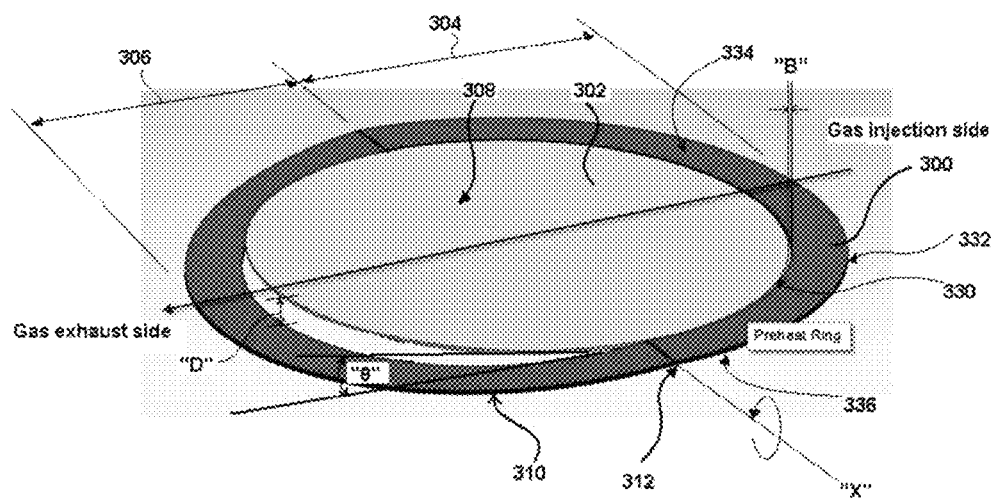
FIG. 3 depicts a perspective view of a pre-heat ring that may be used to replace the pre-heat ring of FIG. 2 according to one embodiment.

FIG. 3 illustrates a perspective view of a pre-heat ring 300 that may be used to replace the pre-heat ring 232 of FIG. 2 according to one embodiment. The pre-heat ring 300 has a central opening which is sized to dispose around the periphery of a substrate support 302, such as the substrate support 214 of FIG. 2. The pre-heat ring 300 generally has a round shape when viewing from the top of the pre-heat ring 300, while any other shape including but not limited to, rectangles, polygons, ovals, and the like is also contemplated.

The pre-heat ring 300 has an annular body that is supported by a ring support (not shown), such as the ring support 234 as shown in FIG. 2. The pre-heat ring 300 includes an inner peripheral edge 330, an outer peripheral edge 332, an upper surface 334, and a bottom surface 336 opposing the upper surface 334. The pre-heat ring 300 is positioned to separate from the substrate support 302 by a predetermined gap "B", which may range from about 0.1 mm to about 0.8 mm, for example about 0.3 mm. The pre-heat ring 300 may have a larger or smaller gap "B" as long as the gap allows rotation of the substrate support 302 and the purge gas to seep between the pre-heat ring 300 and the substrate support 302 with eliminated or minimized dilution effect to the process gases.

The pre-heat ring 300 may include a first half circular portion 304 and a second half circular portion 306 that is substantially identical to the first half circular portion 304. The first half circular portion 304 and the second half circular portion 306 are substantially symmetric to each other with respect to a center axis "X" passing through a central point 312 in the diameter direction of the pre-heat ring 300. The first and second half circular portions 304, 306 may be formed as a single integral body or two separate pieces welding into an integral piece. The first half circular portion 304 may be positioned in proximity to the gas injection side where a process gas inlet, for example the process gas inlet 240 of FIG. 2, is located. The second half circular portion 306 may be positioned in proximity to the gas exhaust side where a process gas outlet, for example the process gas outlet 242 of FIG. 2, is located.

The first half circular portion 304 may have a substantially flat upper surface and a substantially flat bottom surface that is opposite and parallel to the flat upper surface. The second half circular portion 306 may have a substantially flat upper surface and a substantially flat bottom surface that is opposite and parallel to the flat upper surface. In one embodiment shown in FIG. 3, the second half circular portion 306 generally slops downwardly away from the gas injection side and towards the gas exhaust side. Specifically, the second half circular portion 306 is tilted downwardly towards the gas exhaust side by a predetermined angle "θ" with respect to a horizontal plane of the substrate support 302 defining a substrate support surface 308, or with respect to the upper surface of the first half circular portion 304 that is generally parallel to the substrate support surface 308. The predetermined angle "θ" may vary between about 1° and about 15°, such as about 1° to about 3°, about 3° to about 5°, about 5° to about 7°, about 7° to about 9°, about 9° to about 11°, about 11° to about 13°, and about 13° to about 15°. In one example, the predetermined angle "θ" is about 2° to about 6°, for example about 3°. The second half circular portion 306 tilting downwardly at an angle of about 3° generally results in a gap height "D" of about 5 mm to about 15 mm, measured between the second half circular portion 306 and the substrate support surface 308 at the far end of the substrate support 302 on the gas exhaust side. It is noted that the gap "B" between the pre-heat ring 300 and the substrate support 302 should be kept small to minimize the dilution effect to the process gases on the gas injection side while large enough for the lower part of the second half circular portion 306 to not be interfered with the substrate disposed on the substrate support 302 when moving the substrate support up and down.

It is understood that a ring support, such as the ring support 234 of FIG. 2, used to support the pre-heat ring 300 may be modified accordingly to accommodate different heights of the pre-heat ring 300. That is, the height of the ring support at the gas exhaust side is adjusted to be relatively lower than the height of the ring support at the gas injection side to accommodate the tilted angle of the second half circular portion 306 of the pre-heat ring 300. The reduced height of the ring support at the gas exhaust side may generally correspond to the gap height "D" shown in FIG. 3. The ring support may be modified such that the profile of the ring support at least follows approximately the tilted surface 310 of the second half circular portion 306 of the pre-heat ring 300.

The pre-heat ring 300 having a portion (i.e., the second half circular portion 306) tilted downwardly towards the gas exhaust side is believed to reduce the dilution effect of the process gases near the edge of the substrate because the increased gap height "D" between the second half circular portion 306 and the substrate support surface 308 will allow more purge gas to flow through the gas exhaust side than the gas injection side. Therefore, the purge gas coming up on the gas injection side is reduced, thereby eliminating or minimizing the turbulence and/or the flow resistance layer created by the purge gas near the edge of the substrate. As a result, the edge roll-off effect during deposition as discussed in the background of this disclosure is reduced.

In addition, the tilted angle of the second half circular portion 306 of the pre-heat ring 300 prevents the pre-heat ring 300 from rotating during process because the tilted surface 310 of the second half circular portion 306 of the pre-heat ring 300 is self-locking to the upper surface of the ring support. Therefore, the pre-heat ring 300 does not have the lateral misalignment or shift issue (and therefore non-uniformity of the film thickness) as would otherwise have with a conventional non-tilted pre-heat ring (i.e., the pre-heat ring is entirely flat along the diameter direction of the pre-heat ring) due to rotation of the substrate support in the neighborhood during process. If necessary, the upper surface of the ring support may provide two or more pockets or recesses configured to receive corresponding raised portions (such as protrusions or bumps) formed on the pre-heat ring 300 to further constraint the lateral movement of the pre-heat ring 300 during process.

The pre-heat ring 300 may be made from quartz, silicon carbide ($SiC_y$), graphite coated with silicon carbide ($SiC_y$), opaque quartz, coated quartz, or any similar, suitable material that is resistant to chemical breakdown by process gases, wherein y represents known silicon carbide components. In one embodiment, the pre-heat ring 300 comprises graphite coated with silicon carbide.

Figure 4:
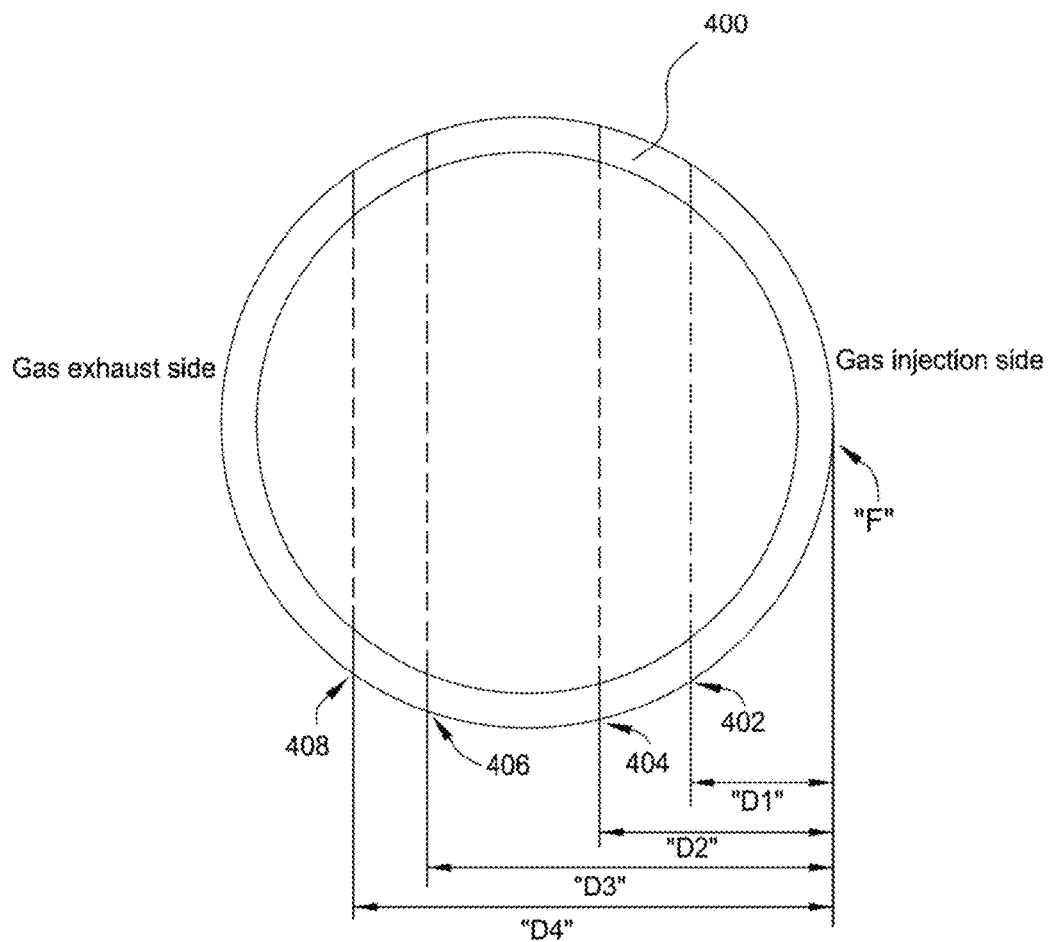
FIG. 4 depicts a top view of a pre-heat ring that may be used to replace the pre-heat ring of FIG. 2 according to another embodiment.

While the pre-heat ring 300 is discussed herein to have the first and second half circular portions 304, 306 constructed symmetric to each other, the pre-heat ring 300 may have more or less percentage of tilting portions to manipulate the dilution effect of the process gases near the edge of the substrate and improve deposition uniformity. More percentage of portion tilting towards the gas exhaust side allows more purge gas to flow through the gas exhaust side than the gas injection side. FIG. 4 illustrates a top view of a pre-heat ring 400 that may be used to replace the pre-heat ring 232 of FIG. 2 according to another embodiment. FIG. 4 shows the pre-heat ring 400 may have a tilting portion starts sloping downwardly at various points of the pre-heat ring 400, for example, at a first point 402 at a distance "$D_1$" from the far end "F" of the pre-heat ring 400 on the gas injection side. The first point 402 is the point passing through pre-heat ring 400 in the diameter direction.

For a process chamber designed or constructed to process 300 mm substrates, the pre-heat ring 400 may have an outer diameter of about 320 mm to about 360 mm, for example about 340 mm, and a radial width of about 5 mm to about 30 mm. In such a case, the distance "$D_1$" may be about 30 mm to about 60 mm, which approximately corresponds to about 80% to about 90% of the pre-heat ring 400 being tilted downwardly towards the gas exhaust side in the diameter direction of the pre-heat ring 400. Similarly, in some embodiments the pre-heat ring 400 may have a tilting portion starts sloping downwardly at a second point 404 at a distance "$D_2$" from the far end "F" of the pre-heat ring 400 on the gas injection side. The second point 404 is the point passing through pre-heat ring 400 in the diameter direction. The distance "$D_2$" may be about 90 mm to about 120 mm, which approximately corresponds to about 65% to about 75% of the pre-heat ring 400 being tilted downwardly towards the gas exhaust side in the diameter direction of the pre-heat ring 400. Similarly, in some embodiments the pre-heat ring 400 may have a tilting portion starts sloping downwardly at a third point 406 at a distance "$D_3$" from the far end "F" of the pre-heat ring 400 on the gas injection side. The third point 406 is the point passing through pre-heat ring 400 in the diameter direction. The distance "$D_3$" may be about 190 mm to about 220 mm, which approximately corresponds to about 35% to about 45% of the pre-heat ring 400 being tilted downwardly towards the gas exhaust side in the diameter direction of the pre-heat ring 400. Similarly, in some embodiments the pre-heat ring 400 may have a tilting portion starts sloping downwardly at a fourth point 408 at a distance "$D_4$" from the far end "F" of the pre-heat ring 400 on the gas injection side. The fourth point 408 is the point passing through pre-heat ring 400 in the diameter direction. The distance "$D_4$" may be about 230 mm to about 260 mm, which approximately corresponds to about 25% to about 35% of the pre-heat ring 400 being tilted downwardly towards the gas exhaust side in the diameter direction of the pre-heat ring 400. In any of these embodiments, the tilting portion may be at a predetermined angle "θ" of about 1° and about 15°, for example about 3° to about 6°, with respect to a horizontal plane defining a substrate support surface.

Figure 5:
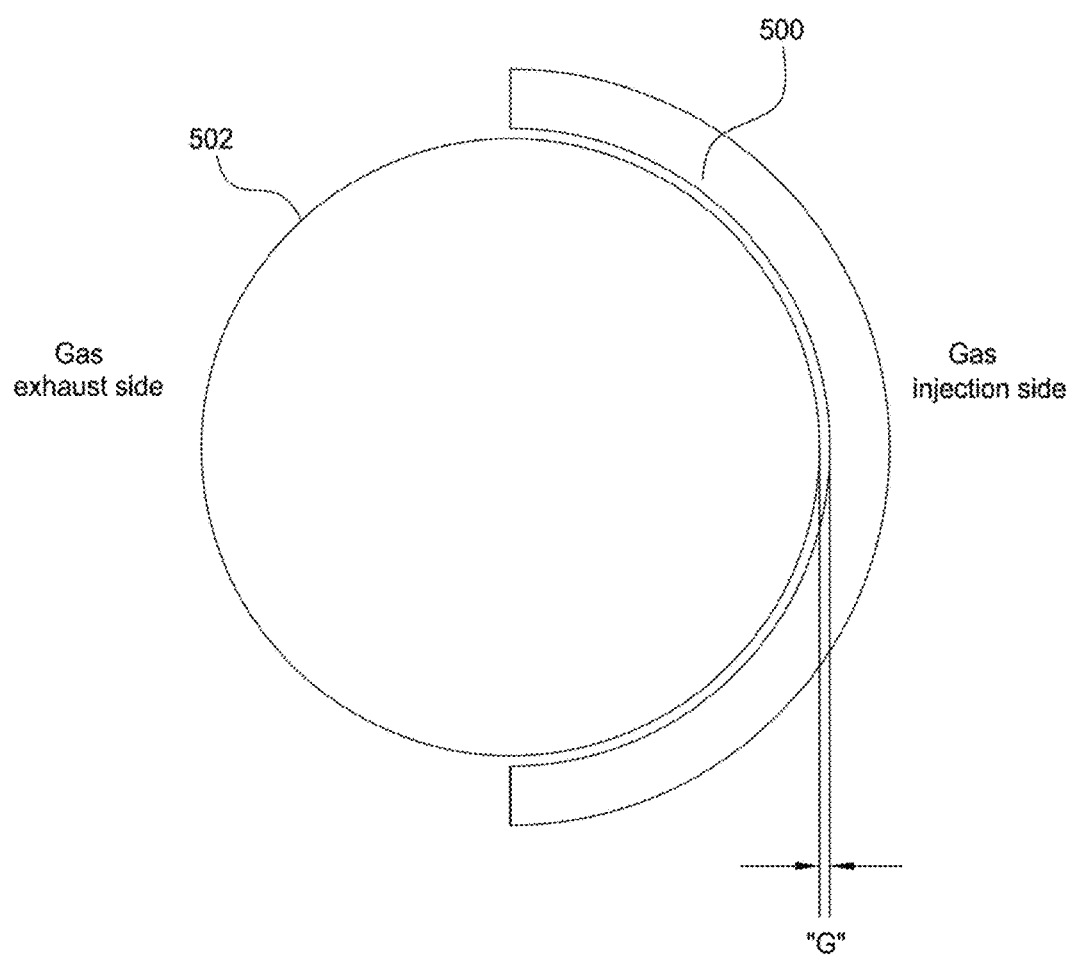
FIG. 5 depicts a top view of a pre-heat ring that may be used to replace the pre-heat ring of FIG. 2 according to yet another embodiment.

FIG. 5 illustrates a top view of a pre-heat ring 500 that may be used to replace the pre-heat ring 232 of FIG. 2 according to another embodiment. The pre-heat ring 500 is similar to the pre-heat ring 300 as shown in FIG. 3 except that the second half circular portion 306 is removed. In other words, the pre-heat ring 500 is a single half circular piece when viewing from the top of the pre-heat ring 500. The pre-heat ring 500 is positioned to separate from the substrate support 502 by a predetermined gap "G", which may range from about 0.1 mm to about 0.8 mm, for example about 0.3 mm. The pre-heat ring 500 may have a larger or smaller gap "G" as long as the gap allows rotation of the substrate support 502 and the purge gas to seep between the pre-heat ring 500 and the substrate support 502 with eliminated or minimized dilution effect to the process gases.

The pre-heat ring 500 is sized to partially surround the periphery of a substrate support 502, such as the substrate support 214 of FIG. 2. In one embodiment, the pre-heat ring 500 may only surround the substrate support 502 on the gas injection side because heating of the process gases is mainly needed at the gas injection side. In one embodiment shown in FIG. 5, the pre-heat ring 500 formed of a single half circular piece is configured to surround about 50% of the circumference of the substrate support 502 on the gas injection side. As a result of the pre-heat ring 500 surrounding primarily about a half circumference of the substrate support 502 on the gas injection side, more purge gas will flow through the gas exhaust side than the gas injection side. Therefore, the purge gas coming up on the gas injection side is reduced, thereby eliminating or minimizing the turbulence and/or the flow resistance layer created by the purge gas near the edge of the substrate. As a result, the edge roll-off effect during deposition as discussed in the background of this disclosure is reduced.

In some embodiments, the pre-heat ring 500 formed of a single half circular piece may be configured to surround more or less percentage of the circumference of the substrate support 502 on the gas injection side. For example, the pre-heat ring 500 may surround about 15% to about 95% of the circumference of the substrate support 502, such as about 20% to about 30%, about 30% to about 40%, about 40% to about 50%, about 50% to about 60%, about 60% to about 70%, about 70% to about 80%, about 80% to about 90% of the circumference of the substrate support 502, with the gas injection side being substantially covered by the pre-heat ring to eliminate or minimize the dilution effect to the process gases on the gas injection side.

The pre-heat ring 500 may be made from quartz, silicon carbide ($SiC_y$), graphite coated with silicon carbide ($SiC_y$), opaque quartz, coated quartz, or any similar, suitable material that is resistant to chemical breakdown by process gases, wherein y represents known silicon carbide components. In one embodiment, the pre-heat ring 500 comprises graphite coated with silicon carbide.

To prevent lateral misalignment or shift issue (and therefore non-uniformity of the film thickness) due to the rotation of the substrate support in the neighborhood during process, the bottom surface of the pre-heat ring 500 may provide two or more raised portions (such as protrusions or bumps) so that the pre-heat ring 500 can be securely retained on a ring support, such as the ring support 234 of FIG. 2 used to support the pre-heat ring, by means of the corresponding pockets or recesses (used to receive the raised portions) formed on the upper surface of the ring support. Alternatively, a fastening approach such as a screw, a bolt, or a clip may also be used to secure the pre-heat ring.

In summary, a processing apparatus having a pre-heat ring is disclosed. The pre-heat ring may have a portion tilted downwardly towards the gas exhaust side to promote the purge gas flowing more through the gas exhaust side than the gas injection side. The tilted pre-heat ring as disclosed herein is able to decrease dilution of the process gases near the edge of the substrate, which in turn improves the uniformity of the film thickness. The tilted pre-heat ring also helps reduce particle contamination on the substrate coming with the purge gas flowing from the lower processing region of the process chamber. Moreover, the tilted pre-heat ring eliminates the problem of the pre-heat ring rotating (and thus shifting laterally) during process due to the pre-heat ring self-locking to the ring support with its tilted angle feature. The embodiments disclosed herein can be used to improve flow and deposition for all reduced pressure cross-flow reactors where the bottom chamber is purged and purge gases are flowing to process chamber.

While the foregoing is directed to embodiments of the present disclosure, other and further embodiments of the disclosure may be devised without departing from the basic scope thereof, and the scope thereof is determined by the claims that follow.

The invention claimed is:

1. A pre-heat ring assembly for use in a semiconductor processing chamber, comprising:
an annular body that has a central opening sized to be disposed around the periphery of a substrate support, the annular body comprising a first half circular portion and a second half circular portion, wherein:
the first half circular portion has an upper surface and a bottom surface parallel to the upper surface,
the second half circular portion has an upper surface and a bottom surface parallel to the upper surface of the second half circular portion,
the first half circular portion connects to the second portion along a line across the annular body through the central opening,
the upper surface of the first half circular portion forms an angle with the upper surface of the second half circular portion, and
the upper surface of the second half circular portion is tilted downwardly with respect to the upper surface of the first half circular portion at the angle so that the upper surface of the second half circular portion is tilted downwardly with respect to the substrate support surface of the substrate support at the angle and the second half circular portion is tilted downwardly towards an gas exhaust side of the semiconductor processing chamber.

2. The pre-heat ring assembly of claim 1, wherein the second half circular portion is substantially symmetric to the first half circular portion.

3. The pre-heat ring assembly of claim 1, wherein the angle is about 2° to about 6°.

4. The pre-heat ring assembly of claim 1, wherein the first half circular portion and the second half circular portion of the annular body are formed as a single integral piece.

5. A process chamber for processing a substrate, comprising:
a chamber body defining an interior processing region;
a substrate support disposed within the chamber body, the substrate support having a substrate support surface; and
a pre-heat ring assembly comprising an annular body that has a central opening, the annular body being positioned on a ring support disposed within the chamber body so that the central opening is disposed around the periphery of the substrate support, the annular body comprising a first half circular portion and a second half circular portion, wherein:
the first half circular portion has an upper surface and a bottom surface parallel to the upper surface,
the second half circular portion has an upper surface and a bottom surface parallel to the upper surface of the second portion,
the first half circular portion connects to the second portion along a line across the annular body through the central opening,
the upper surface of the first half circular portion forms an angle with the upper surface of the second half circular portion, and
the upper surface of the second half circular portion is tilted downwardly with respect to the substrate support surface at the angle so that the second half circular portion is tilted towards an gas exhaust side of the chamber body.

6. The process chamber of claim 5, wherein the annular body is separated from the periphery of the substrate support by a gap.

7. The process chamber of claim 6, wherein the gap is between about 0.1 mm and about 0.8 mm.

8. The process chamber of claim 5, wherein the angle is between about 2° to about 6°.

9. The process chamber of claim 5, wherein the second half circular portion is substantially symmetric to the first half circular portion.

10. The process chamber of claim 5, wherein the first half circular portion is positioned in proximity to a gas injection side of the chamber body.

11. The process chamber of claim 5, wherein the second half circular portion is positioned in proximity to a gas exhaust side of the chamber body.

12. The process chamber of claim 5, wherein the first half circular portion and the second half circular portion of the annular body are formed as a single integral piece.

13. A process chamber for processing a substrate, comprising:
a rotatable substrate support disposed within the process chamber, the substrate support having a substrate support surface;
a lower dome disposed below the substrate support;
an upper dome disposed relatively above the substrate support, the upper dome being opposed to the lower dome;
a ring body disposed around a periphery of the substrate support between the upper dome and the lower dome, wherein the upper dome, the ring body, and the lower dome define an internal volume of the process chamber, the ring body having one or more gas injects arranged in at least one linear group; and
a pre-heat ring assembly comprising an annular body that has a central opening, the annular body being positioned on a ring support disposed within the ring body so that the central opening is disposed around the periphery of the substrate support, the annular body comprising:
a first half circular portion disposed in proximity to a gas injection of the process chamber and
a second half circular portion disposed in proximity to a gas exhaust of the process chamber, wherein:
the first half circular portion has an upper surface and a bottom surface parallel to the upper surface,
the second half circular portion has an upper surface and a bottom surface parallel to the upper surface of the second half circular portion,
the first half circular portion connects to, and forms an angle with, the second half circular portion along a line across the body through the central opening, and
the upper surface of the second half circular portion is tilted downwardly with respect to the substrate support surface at the angle so that the second half circular portion is tilted towards the gas exhaust of the chamber body.

14. The process chamber of claim 13, wherein the angle is about 2° to about 6°.

15. The process chamber of claim 13, wherein the first half circular portion and the second half circular portion of the annular body are formed as a single integral piece.

* * * * *